United States Patent
Strong et al.

(10) Patent No.: US 10,629,557 B2
(45) Date of Patent: Apr. 21, 2020

(54) IMPROVING MECHANICAL AND THERMAL RELIABILITY IN VARYING FORM FACTORS

(71) Applicant: Intel Corporation, Santa Clara, CA (US)

(72) Inventors: Veronica A Strong, Chandler, AZ (US); Sasha N. Oster, Chandler, AZ (US); Shawna M. Liff, Scottsdale, AZ (US)

( * ) Notice: Subject to any disclaimer, the term of this patent is extended or adjusted under 35 U.S.C. 154(b) by 0 days.

(21) Appl. No.: 16/464,930

(22) PCT Filed: Dec. 30, 2016

(86) PCT No.: PCT/US2016/069497
§ 371 (c)(1),
(2) Date: May 29, 2019

(87) PCT Pub. No.: WO2018/125209
PCT Pub. Date: Jul. 5, 2018

(65) Prior Publication Data
US 2019/0312001 A1    Oct. 10, 2019

(51) Int. Cl.
*H01L 23/00* (2006.01)
*H01L 23/498* (2006.01)
(Continued)

(52) U.S. Cl.
CPC .............. *H01L 24/14* (2013.01); *H01L 23/00* (2013.01); *H01L 23/482* (2013.01);
(Continued)

(58) Field of Classification Search
None
See application file for complete search history.

(56) References Cited

U.S. PATENT DOCUMENTS

| 5,629,566 A * | 5/1997 | Doi | H01L 21/563 257/711 |
| 5,814,401 A * | 9/1998 | Gamota | H01L 24/83 428/343 |

(Continued)

FOREIGN PATENT DOCUMENTS

WO    WO-2018125209 A1    7/2018

OTHER PUBLICATIONS

Moon, Sungwook, et al. "Magnetically Aligned Anisotropic Conductive Adhesive for Microwave Applications." IEEE Transactions on Microwave Theory and Techniques, vol. 56, No. 12, 2008, pp. 2942-2949., doi:10.1109/tmtt.2008.2007309. (Year: 2008).*

(Continued)

*Primary Examiner* — J. E. Schoenholtz
(74) *Attorney, Agent, or Firm* — Schwegman Lundberg & Woessner, P.A.

(57) ABSTRACT

A system for packaging integrated circuits includes an integrated circuit having one or more integrated circuit terminals. The system for packaging integrated circuits also includes a substrate having one or more substrate terminals. The system for packaging integrated circuits further includes an electrically conductive adhesive in communication with the integrated circuit terminals and the substrate terminals. The electrically conductive adhesive establishes an electrical connection between each of the one or more integrated circuit terminals and the one or more substrate terminals. The electrical connection between each of the one or more integrated circuit terminals and the one or more substrate terminals are enclosed in a dielectric. The system for packaging integrated circuits includes a second adhesive in communication with the integrated circuit and the substrate, wherein the second adhesive couples the integrated circuit and substrate together.

25 Claims, 7 Drawing Sheets

(51) Int. Cl.
  *H01L 25/065* (2006.01)
  *H01L 23/488* (2006.01)
  *H01L 23/482* (2006.01)

(52) U.S. Cl.
  CPC ...... *H01L 23/488* (2013.01); *H01L 23/49811* (2013.01); *H01L 24/31* (2013.01); *H01L 24/81* (2013.01); *H01L 25/0655* (2013.01); *H01L 2224/16225* (2013.01); *H01L 2224/8185* (2013.01); *H01L 2224/8385* (2013.01); *H01L 2224/83192* (2013.01); *H01L 2224/83194* (2013.01); *H01L 2924/0781* (2013.01)

(56) References Cited

U.S. PATENT DOCUMENTS

| | | | | |
|---|---|---|---|---|
| 5,959,362 | A * | 9/1999 | Yoshino | H01L 21/563 257/778 |
| 7,109,061 | B2 * | 9/2006 | Crane | H01L 21/563 257/783 |
| 8,916,981 | B2 * | 12/2014 | Xiu | H01L 23/5385 257/788 |
| 2001/0050422 | A1 | 12/2001 | Kishimoto et al. | |
| 2004/0150118 | A1 * | 8/2004 | Honda | H01L 21/563 257/778 |
| 2006/0154078 | A1 * | 7/2006 | Watanabe | C09J 163/00 428/413 |
| 2007/0063347 | A1 | 3/2007 | Su | |
| 2008/0308915 | A1 | 12/2008 | Shen et al. | |
| 2010/0001411 | A1 * | 1/2010 | Sawada | H01L 24/11 257/778 |
| 2012/0118480 | A1 * | 5/2012 | Paik | C09J 5/06 156/73.1 |
| 2012/0133042 | A1 | 5/2012 | Hayashi et al. | |
| 2014/0290059 | A1 * | 10/2014 | Kawashima | H01B 7/0009 29/876 |
| 2016/0307814 | A1 | 10/2016 | Kobayashi | |

OTHER PUBLICATIONS

He, Yi, et al. "Thermal Characterization of an Epoxy-Based Underfill Material for Flip Chip Packaging." Thermochimica Acta, vol. 357-358, 2000, pp. 1-8., doi:10.1016/50040-6031(00)00357-9. (Year: 2000).*

"International Application Serial No. PCT/US2016/069497, International Search Report dated Sep. 21, 2017", 4 pgs.

"International Application Serial No. PCT/US2016/069497, Written Opinion dated Sep. 21, 2017", 8 pgs.

* cited by examiner

1010 — PREPARING AN INTEGRATED CIRCUIT HAVING ONE OR MORE INTEGRATED CIRCUIT TERMINALS AND A SUBSTRATE HAVING ONE OR MORE SUBSTRATE TERMINALS, FOR INTERCONNECTION, WHEREIN THE INTERCONNECTION OCCURS THROUGH THE USE OF AN ELECTRICALLY CONDUCTIVE ADHESIVE AND A SECOND ADHESIVE;

1020 — PLACING AN INTEGRATED CIRCUIT HAVING ONE OR MORE INTEGRATED CIRCUIT TERMINALS ON THE SUBSTRATE, WHEREIN THE PLACING OF THE INTEGRATED CIRCUIT ON THE SUBSTRATE:

BRINGS THE ELECTRICALLY CONDUCTIVE ADHESIVE INTO COMMUNICATION WITH THE SUBSTRATE TERMINALS AND THE INTEGRATED CIRCUIT TERMINALS;

BRINGS THE SECOND ADHESIVE INTO COMMUNICATION WITH THE SUBSTRATE AND THE INTEGRATED CIRCUIT;

1030 — PROCESSING THE ELECTRICALLY CONDUCTIVE ADHESIVE TO FORM BOTH A CONDUCTING PORTION AND AN ADJACENT DIELECTRIC PORTION, WHEREIN:

THE CONDUCTING PORTION ESTABLISHES AN ELECTRICAL CONNECTION BETWEEN EACH OF THE ONE OR MORE SUBSTRATE TERMINALS AND THE ONE OR MORE INTEGRATED CIRCUIT TERMINALS; AND

THE ADJACENT DIELECTRIC PORTION ELECTRICALLY ISOLATES EACH OF THE CONDUCTING PORTIONS FROM THE OTHER CONDUCTING PORTIONS.

IMPROVING MECHANICAL AND THERMAL RELIABILITY IN VARYING FORM FACTORS

This application is a U.S. National Stage Filing under 35 U.S.C. 371 from International Application No. PCT/US2016/069497, filed on Dec. 30, 2016, which is incorporated herein by reference in its entirety.

BACKGROUND

Integrated circuits are packaged in a variety of ways. An integrated circuit can be packaged by interconnecting the integrated circuit with a substrate. The integrated circuit and the substrate can be electrically interconnected with solder or wire bonding. A polymer may then filled into the voids between the interconnections of the integrated circuit and the substrate to provide a more robust mechanical coupling of the integrated circuit and the substrate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A problem to be solved can include reducing the thermal stresses, in an integrated circuit ("IC") and the integrated circuit packaging, that is generated by differing coefficients of thermal expansion of the various materials in the IC and the IC packaging. The present subject matter can help provide a solution to this problem, such as by utilizing an electrically conductive adhesive in combination with a second adhesive, wherein the second adhesive is responsible for a substantial portion of the mechanical coupling of the IC and the IC packaging.

A system for packaging integrated circuits includes an integrated circuit having one or more integrated circuit terminals. The system for packaging integrated circuits also includes a substrate having one or more substrate terminals. The system for packaging integrated circuits further includes an electrically conductive adhesive in communication with the integrated circuit terminals and the substrate terminals. The electrically conductive adhesive establishes an electrical connection between each of the one or more integrated circuit terminals and the one or more substrate terminals. The electrical connection between each of the one or more integrated circuit terminals and the one or more substrate terminals are enclosed in a dielectric. The system for packaging integrated circuits includes a second adhesive in communication with the integrated circuit and the substrate, wherein the second adhesive couples the integrated circuit and substrate together.

This overview is intended to provide an overview of subject matter of the present patent application. It is not intended to provide an exclusive or exhaustive explanation of the invention. The detailed description is included to provide further information about the present patent application.

Figure 1:
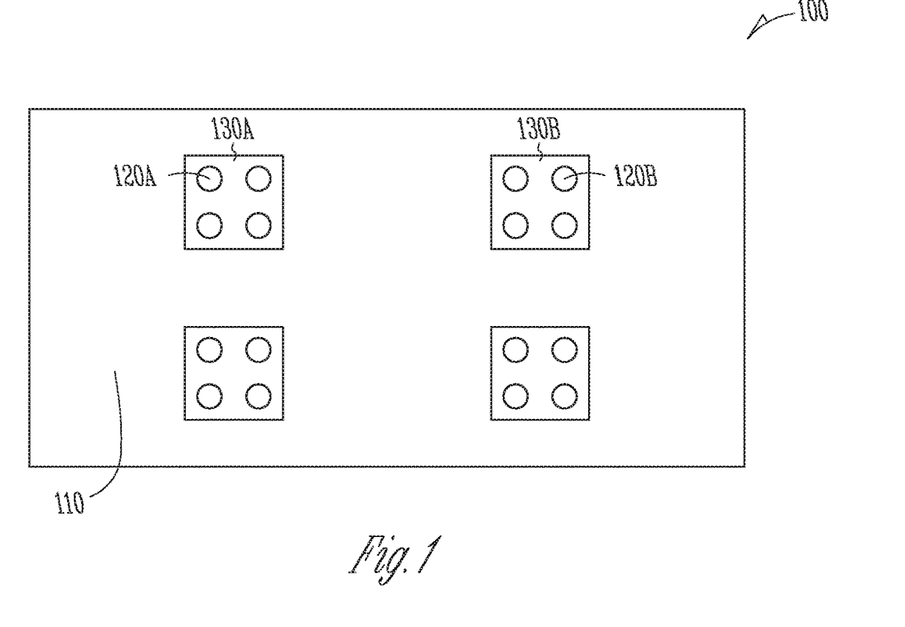
FIG. 1 is an orthographic view of an example of an integrated circuit package.

FIG. 1 is an orthographic view of an example of an integrated circuit package 100. The integrated circuit package 100 can include a substrate 110; one or more substrate terminals 120A. B; and one or more pad areas 130A. B. The substrate can be a silicon wafer, silicon, a printed circuit board, a substrate with a chip, or the like. The one or more substrate terminals 120A. B can be coupled to the substrate 110. The one or more substrate terminals 120A, B can be electrically conductive terminals, pads, interconnects, or the like. The one or more substrate terminals 120A, B can be gold, silver, copper, aluminum, or the like. The one or more substrate terminals 120A, B The one or more substrate terminals 120A. B can each be electrically coupled to a corresponding lead (not shown). The lead (e.g., a copper trace, wire bonds, or the like) can transmit electrical energy from the one or more substrate terminals (e.g., substrate terminal 120A) to a different portion of the substrate 110. The lead can transmit electrical energy from the one or more substrate terminals (e.g., substrate terminal 120A) to a different substrate terminal (e.g., substrate terminal 120B). One or more leads can transmit electrical energy from one or more corresponding substrate terminals. The leads 110 can transmit electrical energy from the one or more corresponding substrate terminals to a different portion of the substrate 110, to a second substrate, to an integrated circuit, or to another electronic device. The use of one or more leads can simplify interconnection of the substrate 110 with other electronic devices such as by providing a more robust structure to establish a physical and/or electrical connection.

The one or more pad areas 130A. B can be a region where an electrically conductive adhesive can be applied (e.g., transferred to), as will be discussed further herein. The one or more pad areas 130A, B can be the region proximate to (e.g., surrounding or enclosing) the one or more substrate terminals 120A. B. The one or more pad areas 130A, B can be circular, square, other polygons, or amorphous in shape.

Figure 2:
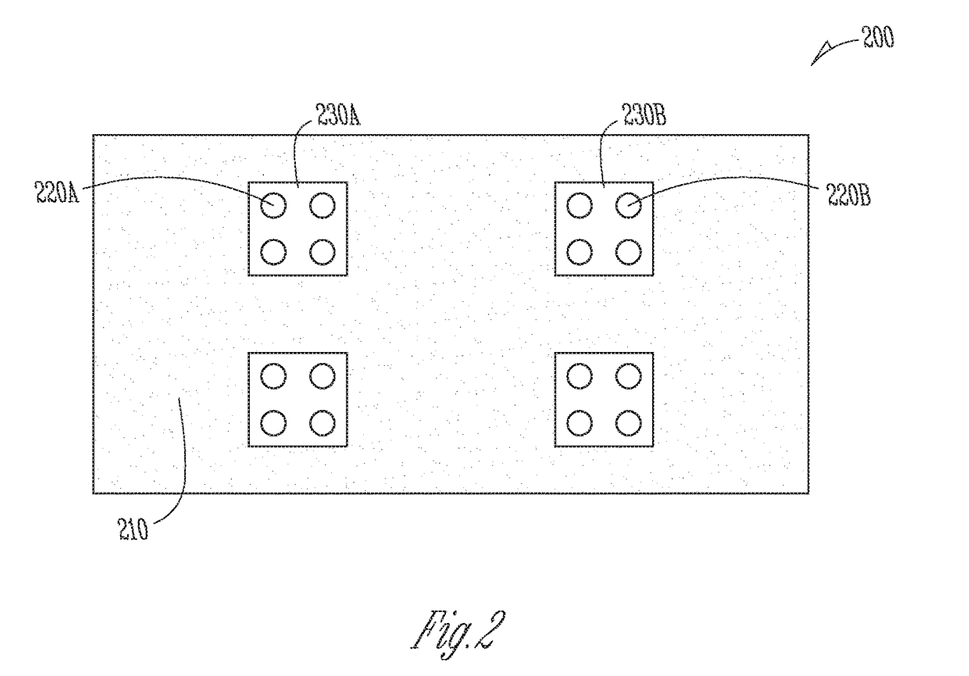
FIG. 2 is an orthographic view of an example of an integrated circuit.

FIG. 2 is an orthographic view of an example of an integrated circuit 200. The integrated circuit 200 can include a silicon wafer 210; one or more integrated circuit terminals 220A, B; and one or more pad areas 230A, B. An integrated circuit can be manufactured on an appropriate semiconductor substrate (e.g., silicon wafer 210 or an individual die). One or more integrated circuits (e.g., integrated circuit 200) can be manufactured together on an appropriate semiconductor substrate (e.g., silicon wafer 210). The one or more integrated circuits can be singulated to form one or more components. The one or more integrated circuit terminals 220A. B can be electrically conductive terminals, pads, interconnects, or the like. The one or more integrated circuit terminals 220A. B can transmit electrical signals through the integrated circuit 200, such as to perform a specified function (e.g., amplify an input signal, process information, store information, or the like). The one or more pad areas 230A, B can be a region where an electrically conductive adhesive can be applied, as will be discussed further herein. The one or more pad areas 230A, B can be the region proximate to (e.g., surrounding or enclosing) the one or more integrated circuit terminals 220A, B.

One of ordinary skill in the art, having the benefit of the present disclosure, will recognize that the subject matter contained herein can be applied to integrated circuits, substrates, and integrated circuit packages, or any combination thereof. The subject matter contained herein uses a substrate (e.g., substrate 310 of FIG. 3) as an example, but the subject matter is similarly applicable to silicon wafers (e.g., silicon wafer 210 of FIG. 2 or a Wafer Level Fan Out), an integrated circuit, and dice.

Figure 3:
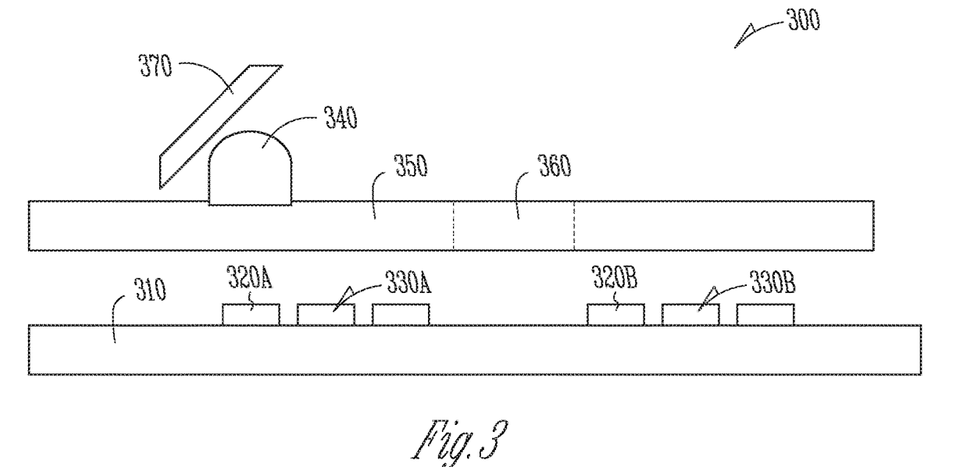
FIG. 3 is an orthographic view of an example of a system for packaging an integrated circuit, wherein a second adhesive is applied to a substrate with a stencil.

FIG. 3 is an orthographic view of an example of a system for packaging an integrated circuit 300, wherein a second adhesive 340 is applied to an integrated circuit package with a stencil. The system for packaging an integrated circuit 300 can include a substrate 310; one or more substrate terminals 320A, B; one or more pad areas 330A, B; a second adhesive 340; a stencil 350; one or more stencil openings 360; and an applicator 370.

The stencil 350 can be located proximate to the substrate 310. The stencil 350 can have one or more stencil openings 360. The one or more stencil openings 360 can be configured (e.g., sized and shaped) to allow a material (e.g., second adhesive 340) to be applied to the substrate 310. The second adhesive 340 can be applied (e.g., deposited on or transferred to) the stencil 350. The applicator 370 can be placed into communication with the stencil 350 and translated across the surface of the stencil 350. The translation of the applicator 370 across the surface of the stencil 350 can allow the material (e.g., second adhesive 340) to enter the one or more stencil openings 360. The material can then pass through the one or more stencil openings 360 and be deposited on (e.g., transferred to) the substrate 310.

The material (e.g., second adhesive 340) can be processed (e.g., by curing or partially curing the material) to prevent the contamination of the substrate 310 by the material outside of the area defined by the stencil openings 360. The material can be processed to prevent the contamination of process components (e.g., stencil 350, stencil 650 of FIG. 6, applicator 360, or applicator 660 of FIG. 6) by the material outside of the area defined by the stencil openings 360. Stated another way, the material can be processed to prevent the material from spreading beyond the area that it was intended for the material to be applied to.

The material (e.g., second adhesive 340) can be applied to the substrate 310 with a variety of different processes and the present subject matter is not intended to be limited to the stenciling process detailed herein. Various lithographic methods other than stencils can be used to build the disclosed subject matter. Other material application processes can include those processes selected from the group consisting of spraying, printing, vapor deposition, stenciling, lithography, or the like.

Figure 4:
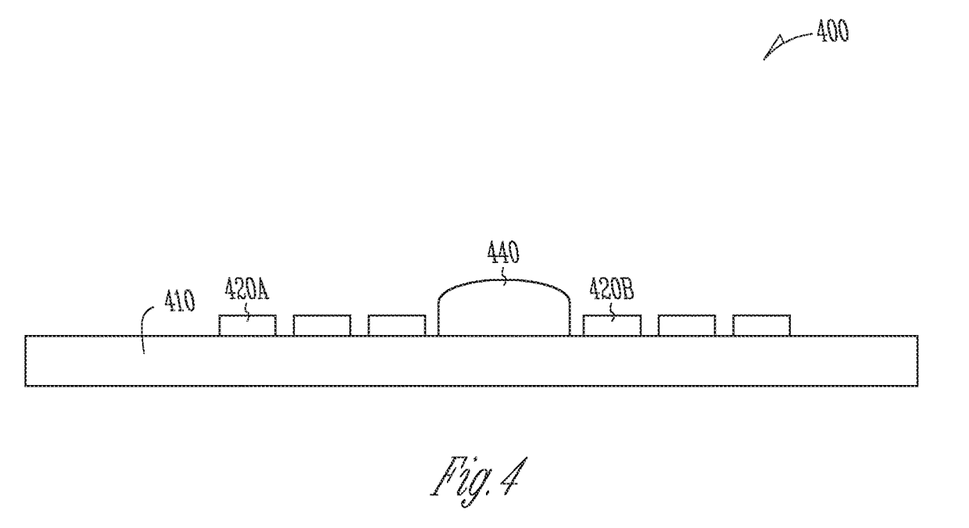
FIG. 4 is an orthographic view of an example of a system for packaging an integrated circuit, wherein the second adhesive has been applied to the integrated circuit package.

FIG. 4 is an orthographic view of an example of a system for packaging an integrated circuit, wherein the second adhesive has been applied to the integrated circuit package. The system for packaging an integrated circuit 400 can include a substrate 410; one or more substrate terminals 420A, B; and a second adhesive 440. In an example, the second adhesive 440 can be cured or partially cured to prevent the second adhesive 440 from spreading beyond the area it was intended for the second adhesive 440 to be applied to.

Figure 5:
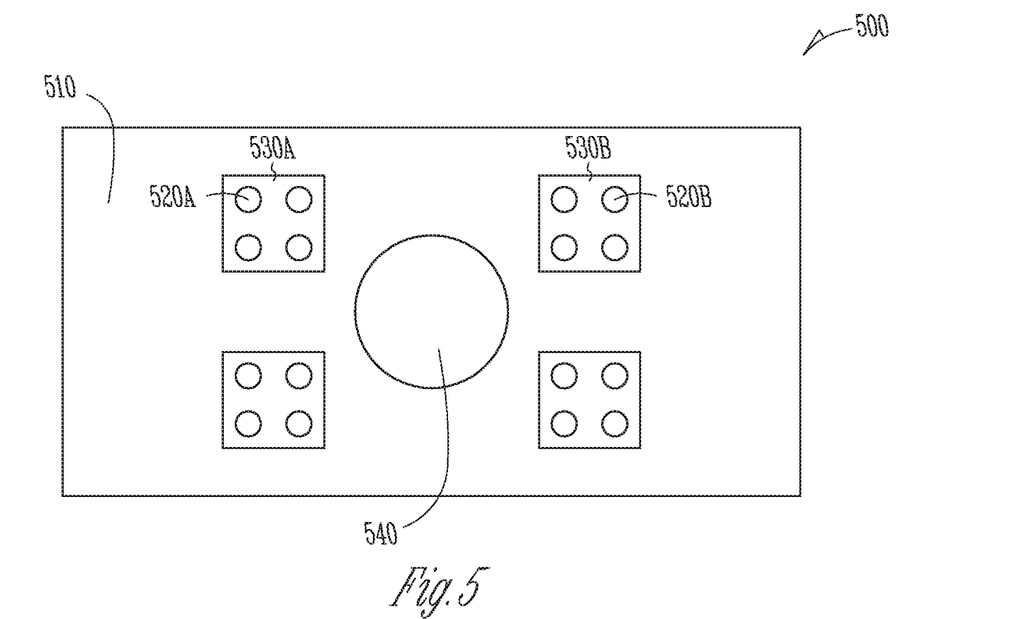
FIG. 5 is a different orthographic view of the system for packaging an integrated circuit of FIG. 4.

FIG. 5 is a different orthographic view of the system for packaging an integrated circuit of FIG. 4. The system for packaging an integrated circuit 500 can include a substrate 510; one or more substrate terminals 520A, B; one or more pad areas 530A. B; and a second adhesive 540. The second adhesive 540 can be applied to the substrate 510 with the exception of the one or more pad areas 530A, B.

Figure 6:
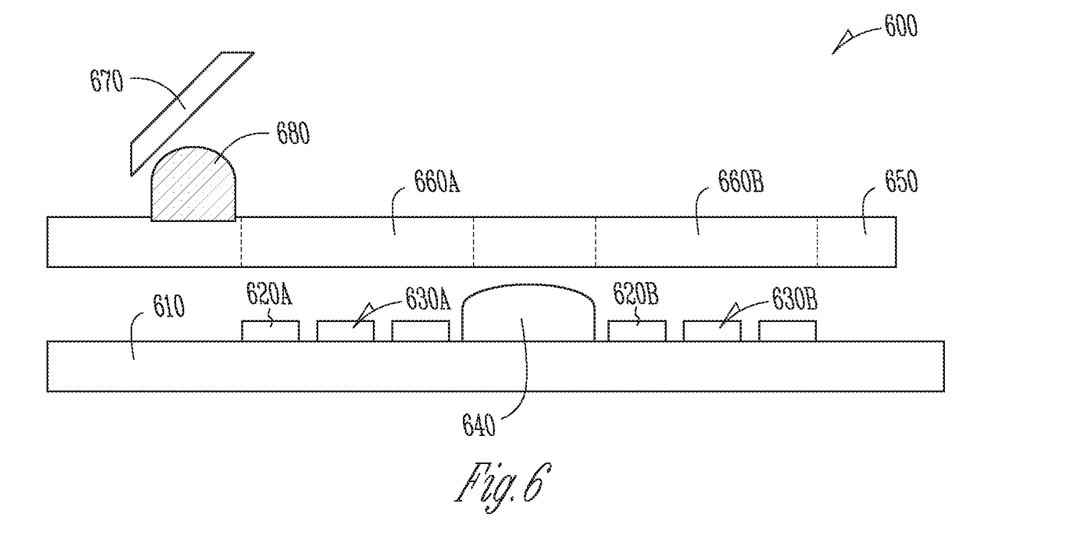
FIG. 6 is an orthographic view of an example of a system for packaging an integrated circuit, wherein an electrically conductive adhesive is applied to an integrated circuit package with a stencil.

FIG. 6 is an orthographic view of an example of a system for packaging an integrated circuit, wherein an electrically conductive adhesive is applied to an integrated circuit package with a stencil. The system for packaging an integrated circuit 600 can include a substrate 610; one or more substrate terminals 620A, B; one or more pad areas 630A, B; a second adhesive 640; a stencil 650; one or more stencil openings 660A, B; an applicator 670; and an electrically conductive adhesive 680.

The stencil 650 can be located proximate to the substrate 610. The stencil 650 can have one or more stencil openings 660. The one or more stencil openings 660 can be sized and shaped to allow a material (e.g., electrically conductive adhesive 680) to be applied to (e.g., transferred to) the substrate terminals 620A. B. The one or more stencil openings 660 can be sized and shaped to allow a material to be applied to the one or more pad areas 630A, B. The one or more stencil openings 660 can be sized and shaped to prevent the contamination of (e.g., prevent the contact or mixing of) the second adhesive 640 with the electrically conductive adhesive 680.

The electrically conductive adhesive 680 can be applied (e.g., deposited on or transferred to) the stencil 650. The applicator 670 can be placed into communication with the stencil 650 and translated across the surface of the stencil 650. The translation of the applicator 670 across the surface of the stencil 650 can allow the material to enter the one or more stencil openings 660. The material (e.g., electrically conductive adhesive 680) can then pass through the one or more stencil openings 660 and be deposited on (e.g., transferred) to the substrate 610; the substrate terminals 620A, B; or the one or more pad areas 630A, B.

Figure 7:
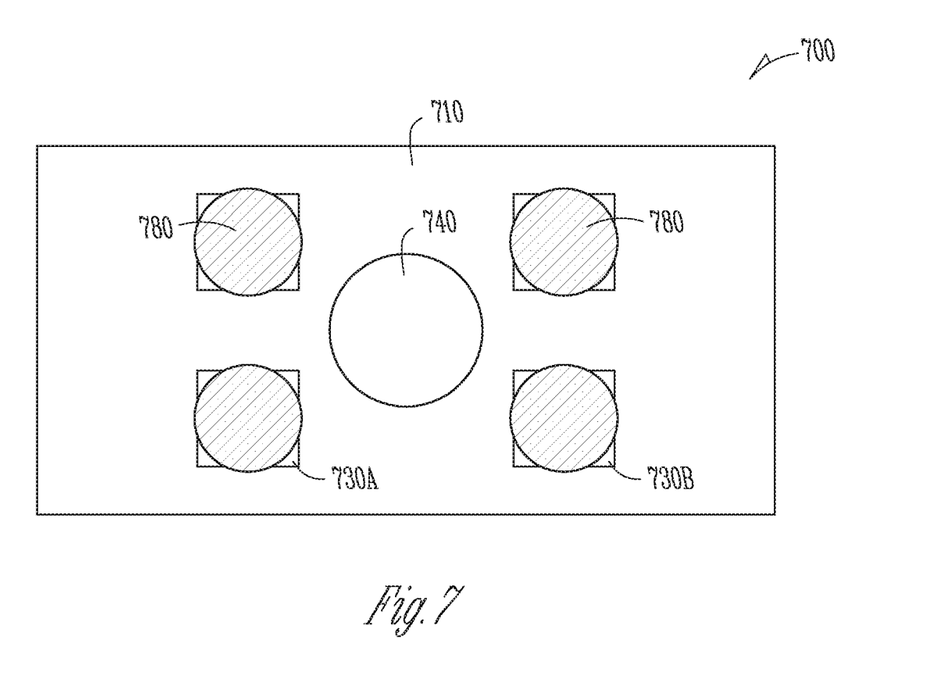
FIG. 7 is an orthographic view of an example of a system for packaging an integrated circuit, wherein the electrically conductive adhesive has been applied to the integrated circuit package.

FIG. 7 is an orthographic view of an example of a system for packaging an integrated circuit 700, wherein the electrically conductive adhesive has been applied to the integrated circuit package. The system for packaging an integrated circuit 700 can include a substrate 710; one or more pad areas 730A, B; a second adhesive 740; and an electrically conductive adhesive 780. As previously discussed herein, the electrically conductive adhesive 780 can be applied to (e.g., be in communication with) the one or more pad areas 730A. B. The electrically conductive adhesive 780 can be applied to the substrate 710 outside the one or more pad areas 730A, B; in contrast to the second adhesive 740 that cannot be applied to the one or more pad areas 730A. B.

The electrically conductive adhesive 780 can be a conductive adhesive only (e.g., solder). The electrically conductive adhesive 780 can be a combination of a non-conductive adhesive and a conductive adhesive (e.g., uncured epoxy and solder, respectively). The electrically conductive adhesive 780 can be comprised of a mixture of a conductor and a polymer. The electrically conductive adhesive 780 can be a composite of one or more metals and one or more polymers. The one or more metals (e.g., conductors) can be selected from the group consisting of gold, silver, copper, aluminum, tin, lead, or the like. The electrically conductive adhesive 780 can include solder as the conductor.

The second adhesive 740 can be selected from the group consisting of glue, cement, epoxy, resin, tape, or the like. The second adhesive 740 can be thermally conductive and electrically insolating. The second adhesive 740 can include a composite of one or more adhesives. The composite can further include aluminum nitride particles. The subject matter disclosed herein (either partially or entirely), with reference to FIGS. 3-7, can be referred to generally as preparing an integrated circuit or a substrate for interconnection.

Figure 8:
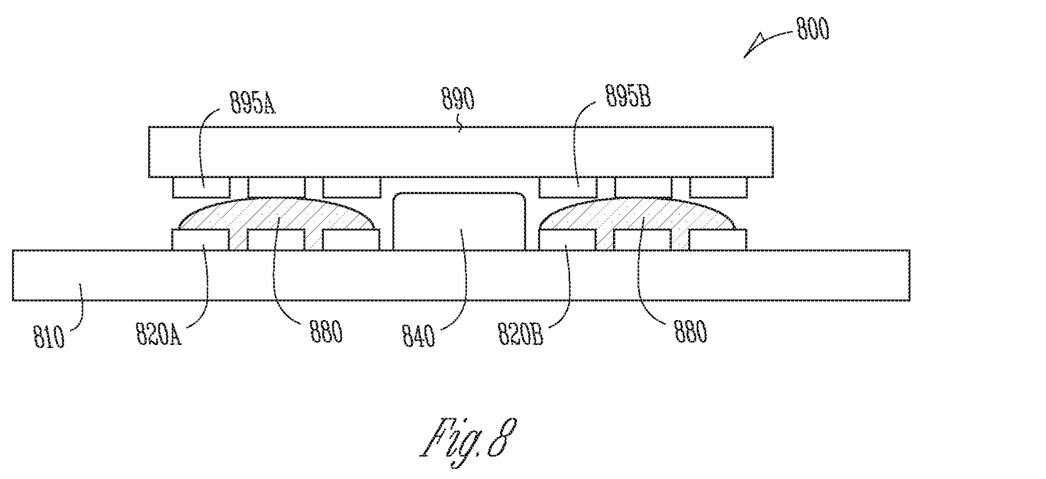
FIG. 8 is an orthographic view of an example of a system for packaging an integrated circuit, wherein a component being placed onto the integrated circuit package of FIG. 7.

FIG. 8 is an orthographic view of an example of a system for packaging an integrated circuit, wherein a component is being placed onto the integrated circuit package of FIG. 7. The system for packaging an integrated circuit 800 can include a substrate 810; one or more substrate terminals 820A, B; a second adhesive 840, an electrically conductive adhesive 880; an integrated circuit 890, and one or more integrated circuit terminals 895A. B. The integrated circuit 890 can be placed proximate to the substrate 810. Placing the integrated circuit 890 proximate to the substrate 810 can align the one or more substrate terminals 820A. B with one or more corresponding integrated circuit terminals 895A, B. Placing the integrated circuit 890 proximate to the substrate 810 can bring the electrically conductive adhesive 880 into communication with the one or more substrate terminals 820A. B and the one or more integrated circuit terminals 895A. B. Placing the integrated circuit 890 proximate to the substrate 810 can bring the second adhesive 840 into communication with the substrate 810 and the integrated circuit 890. Placing the integrated circuit 890 proximate to the substrate 810 can include bringing the electrically conductive adhesive 880 into communication with the one or more substrate terminals 820A, B and the one or more integrated circuit terminals 895A, B. Placing the integrated circuit 890 proximate to the substrate 810 can include bringing the second adhesive 840 into communication with the substrate 810 and the integrated circuit 890.

Figure 9:
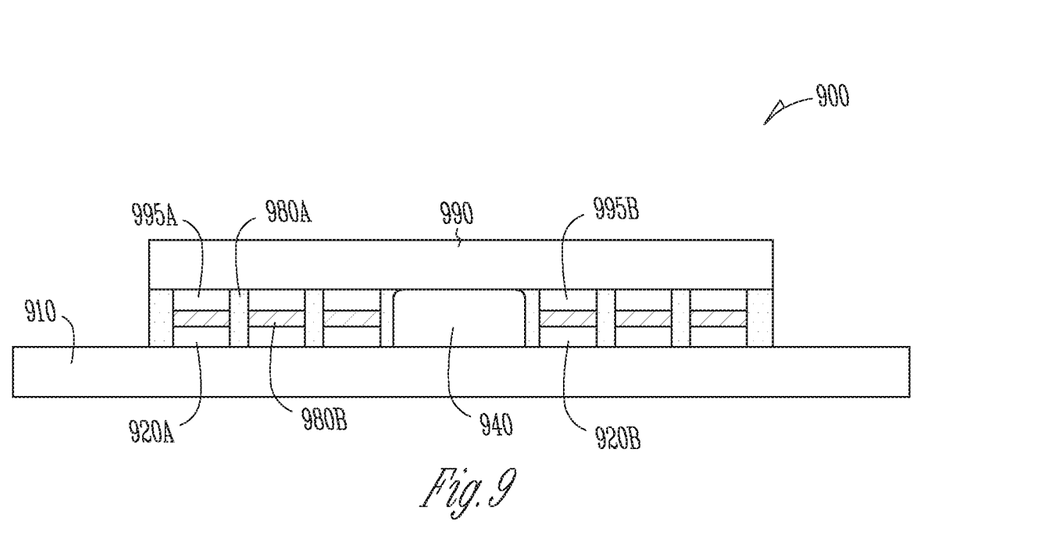
FIG. 9 is an orthographic view of an example of a system for packaging an integrated circuit.

FIG. 9 is an orthographic view of an example of a system for packaging an integrated circuit. The system for packaging an integrated circuit 900 can include a substrate 910; one or more substrate terminals 920A. B; a second adhesive 940, a dielectric portion 980A of an electrically conductive adhesive; a conductor portion 980B of an electrically conductive adhesive; an integrated circuit 990, and one or more integrated circuit terminals 995A, B. The electrically conductive adhesive (e.g., electrically conductive adhesive 880 of FIG. 8) can be processed to form both a conductor portion 980B of an electrically conductive adhesive and an adjacent dielectric portion 980A of an electrically conductive adhesive. The conducting portion 980B can establish an electrical connection between each of the one or more substrate terminals 920A, B and the one or more integrated circuit terminals 995A, B. Stated another way, the conducting portion 980B can establish an electrical connection between each of the one or more substrate terminals 920A, B and each of the one or more corresponding integrated circuit terminals 995A, B. The adjacent dielectric portion 980A can electrically isolate each of the conducting portions 980B from the other conducting portions. The electrical connection between each of the one or more integrated circuit terminals 995A, B and the one or more substrate terminals 920A, B can be electrically isolated and enclosed in a majority dielectric (e.g., dielectric portion 980A).

Processing the electrically conductive adhesive (e.g., electrically conductive adhesive 880 of FIG. 8) can include the electrically conductive adhesive self-aligning into a conducting portion 980B and a dielectric portion 980A when exposed to changing processing conditions. Processing the electrically conductive adhesive can include altering the temperature of the electrically conductive adhesive. Processing the electrically conductive adhesive can include heating the electrically conductive adhesive, the heating resulting in segregation of the conductor from the adhesive and into a conducting portion 980B and a dielectric portion 980A, respectively. Processing the electrically conductive adhesive can include altering the pressure that is applied to the electrically conductive adhesive (e.g., altering the atmospheric pressure of the room housing the electrically conductive adhesive, or applying physical pressure to the electrically conductive adhesive).

In one example, when activated (by heating, or other activating trigger) the electrically conductive adhesive components will become mobile within the composite material. In one example, due to a differential in wetting potential at the interfaces between materials, conductive components in the electrically conductive adhesive will preferentially move towards a metallic surface such as a terminal (e.g., the one or more substrate terminals 820A. B of FIG. 8), and dielectric components of the electrically conductive adhesive will preferentially move towards an exterior of the conductive components. In such an example, the process of forming the electrically conducting portion and the dielectric portion may be termed a self-aligned process. In one example, a microstructure, such as grain alignment, will be present and detectable as a result of the self-alignment process. It is now appreciated that because of this unique self-alignment of the electrically conductive adhesive into a conducting portion 980B and a dielectric portion 980A, the self-alignment will form a unique structure that a person of ordinary skill in the art would be able to detect, such as through routine inspection methods (e.g., sectioning the integrated circuit 900 or through non-destructive evaluation techniques).

The use of an electrically conductive adhesive in combination with a second adhesive can assist in alleviating the thermo-mechanical stresses and strains that are induced into electrical components (e.g., substrate 910 or integrated circuit 990) when the components are operated. The use of a second adhesive can reduce the amount of electrically conductive adhesive required to package an integrated circuit by providing additional mechanical coupling of electrical components. Reducing the amount of electrically conductive adhesive can reduce manufacturing costs. The use of a second adhesive can allow for the second adhesive to provide a substantial portion of the mechanical coupling of electrical components. The use of a second adhesive can allow for a less resilient (e.g., durable, strong, or tough) adhesive component to be used as a constituent in the electrically conductive adhesive The use of a second adhesive can increase the resiliency of an electrically conductive adhesive by transferring a substantial portion of the burden of mechanically coupling electrical components from the electrically conductive adhesive to the second adhesive. Transferring the burden of mechanically coupling electrical components from the electrically conductive adhesive to the second adhesive can reduce the stresses and strains that the electrically conductive adhesive would typically experience when the electrical components are operated. Reducing the stresses and strains that the electrically conductive adhesive experiences can increase the resiliency and/or performance of the electrically conductive adhesive.

Figure 10:
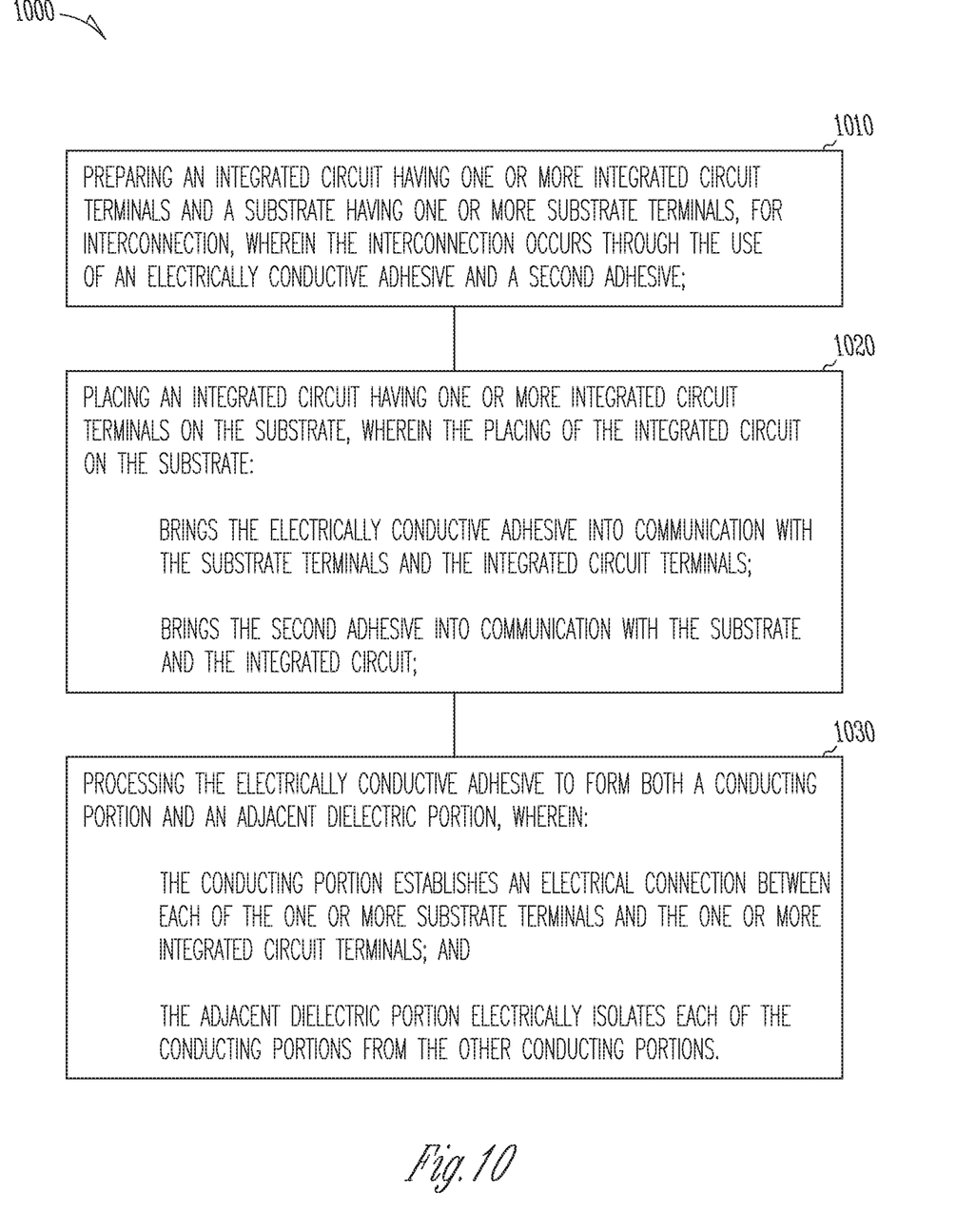
FIG. 10 is a block diagram of a method for forming an integrated circuit.

FIG. 10 is a block diagram of a method for forming an integrated circuit 1000. Operation 1010 can include preparing an integrated circuit having one or more integrated circuit terminals and a substrate having one or more substrate terminals, for interconnection, wherein the interconnection occurs through the use of an electrically conductive adhesive and a second adhesive. Operation 1020 can include placing an integrated circuit having one or more integrated circuit terminals on the substrate. The placing of the integrated circuit on the substrate can bring the electrically conductive adhesive into communication with the one or more substrate terminals and the one or more integrated circuit terminals. The placing of the integrated circuit on the substrate can bring the second adhesive into communication with the substrate and the integrated circuit. Operation 1030 can include processing the electrically conductive adhesive to form both a conducting portion and an adjacent dielectric portion. The conducting portion can establish an electrical connection between each of the one or more substrate terminals and the one or more integrated circuit terminals. The adjacent dielectric portion can electrically isolate each of the conducting portions from the other conducting portions.

The method for forming an integrated circuit 1000 can include transferring the second adhesive and the electrically conductive adhesive onto the substrate and the substrate terminals, respectively, by a process selected from the group consisting of spraying, printing, vapor deposition, stenciling, laminating or the like. The method for forming an integrated circuit 1000 can include transferring the second adhesive and the electrically conductive adhesive onto the integrated circuit and the integrated circuit terminals, respectively, by a process selected from the group consisting of spraying, printing, vapor deposition, stenciling, laminating, or the like.

The method for forming an integrated circuit 1000 can include preparing the integrated circuit and the substrate by transferring the second adhesive onto the substrate and transferring the electrically conductive adhesive onto one or more substrate terminals. The method for forming an integrated circuit 1000 can include preparing the integrated circuit and the substrate by transferring the second adhesive onto the integrated circuit and transferring the electrically conductive adhesive onto one or more integrated circuit terminals. The method for forming an integrated circuit 1000 can include preparing the integrated circuit and the substrate by partially curing the second adhesive prior to transferring the electrically conductive adhesive.

The method for forming an integrated circuit 1000 can include processing the electrically conductive adhesive by altering the temperature of the electrically conductive adhesive. The method for forming an integrated circuit 1000 can include processing the electrically conductive adhesive such as by heating the electrically conductive adhesive, the heating can result in segregation of the conductor from the adhesive and into a conducting portion and a dielectric portion, respectively. The method for forming an integrated circuit 1000 can include processing the electrically conductive adhesive by altering the pressure that is applied to the electrically conductive adhesive. The method for forming an integrated circuit 1000 can include processing the electrically conductive adhesive wherein the processing includes the electrically conductive adhesive self-aligning into a conducting portion and a dielectric portion when exposed to changing processing conditions. The method for forming an integrated circuit 1000 can include singulating the integrated circuit from a silicon wafer.

Figure 11:
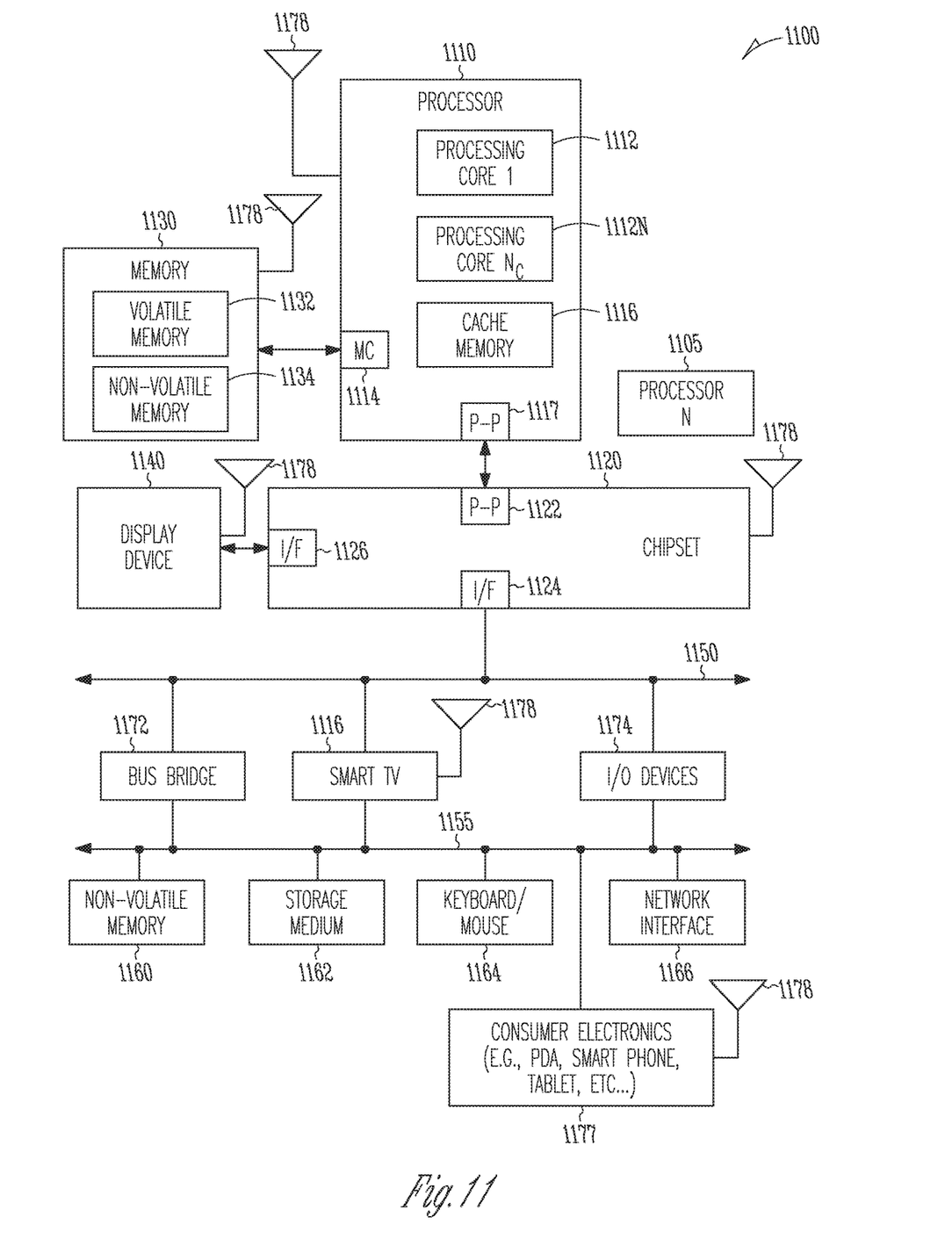
FIG. 11 is a system level diagram, depicting an example of an electronic device (e.g., system) including the system for packaging an integrated circuit

FIG. 11 illustrates a system level diagram, depicting an example of an electronic device (e.g., system) including the system for packaging an integrated circuit as described in the present disclosure. FIG. 11 is included to show an example of a higher level device application for the system for packaging an integrated circuit. In one embodiment, system 1100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1100 is a system on a chip (SOC) system. In some embodiments, system 1100 is a system in package (SiP) system.

In one embodiment, processor 1110 has one or more processor cores 1112 and 1112N, where 1112N represents the Nth processor core inside processor 1110 where N is a positive integer. In one embodiment, system 1100 includes multiple processors including 1110 and 1105, where processor 1105 has logic similar or identical to the logic of processor 1110. In some embodiments, processing core 1112 includes, but is not limited to, pre-fetch logic to fetch instructions, decode logic to decode the instructions, execution logic to execute instructions and the like. In some embodiments, processor 1110 has a cache memory 1116 to cache instructions and/or data for system 1100. Cache memory 1116 may be organized into a hierarchal structure including one or more levels of cache memory.

In some embodiments, processor 1110 includes a memory controller 1114, which is operable to perform functions that enable the processor 1110 to access and communicate with memory 1130 that includes a volatile memory 1132 and/or a non-volatile memory 1134. In some embodiments, processor 1110 is coupled with memory 1130 and chipset 1120. Processor 1110 may also be coupled to a wireless antenna 1178 to communicate with any device configured to transmit and/or receive wireless signals. In one embodiment, an interface for wireless antenna 1178 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1132 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1134 includes, but is not limited to, flash memory, phase change memory (PCM), read-only memory (ROM), electrically erasable programmable read-only memory (EEPROM), or any other type of non-volatile memory device.

Memory 1130 stores information and instructions to be executed by processor 1110. In one embodiment, memory 1130 may also store temporary variables or other intermediate information while processor 1110 is executing instructions. In the illustrated embodiment, chipset 1120 connects with processor 1110 via Point-to-Point (PtP or P-P) interfaces 1117 and 1122. Chipset 1120 enables processor 1110 to connect to other elements in system 1100. In some embodiments of the example system, interfaces 1117 and 1122 operate in accordance with a PtP communication protocol such as the Intel® QuickPath Interconnect (QPI) or the like. In other embodiments, a different interconnect may be used.

In some embodiments, chipset 1120 is operable to communicate with processor 1110, 1105N, display device 1140, and other devices, including a bus bridge 1172, a smart TV 1176, I/O devices 1174, nonvolatile memory 1160, a storage medium (such as one or more mass storage devices) 1162, a keyboard/mouse 1164, a network interface 1166, and various forms of consumer electronics 1177 (such as a PDA, smart phone, tablet etc.), etc. In one embodiment, chipset 1120 couples with these devices through an interface 1124. Chipset 1120 may also be coupled to a wireless antenna 11678 to communicate with any device configured to transmit and/or receive wireless signals.

Chipset 1120 connects to display device 1140 via interface 1126. Display 1140 may be, for example, a liquid crystal display (LCD), a plasma display, cathode ray tube (CRT) display, or any other form of visual display device. In some embodiments of the example system, processor 1110 and chipset 1120 are merged into a single SOC. In addition, chipset 1120 connects to one or more buses 1150 and 1155 that interconnect various system elements, such as I/O devices 1174, nonvolatile memory 1160, storage medium 1162, a keyboard/mouse 1164, and network interface 1166. Buses 1150 and 1155 may be interconnected together via a bus bridge 1172. In one embodiment, mass storage device 1162 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 11 are depicted as separate blocks within the system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into processor core 1112.

Additionally, any one, or combination of the components described with reference to FIG. 11 can be used in conjunction with the subject matter disclosed herein. In an example, the method for forming an integrated circuit 1000 can be used to manufacture any portion of components of the system 1100. The system 1100 can include a first integrated circuit and a second integrated circuit. In an example, the first and second integrated circuits are included in the processor 1110. The system 1100 can further include an electronic component 1190 in communication with one or more components (e.g., chipset 1120) of the system 1100. The first integrated circuit and/or the second integrated circuit can be a die. The electronic component 1190 can be selected from the group consisting of a processor, a touch pad, a display, a global positioning system receiver, a Wi-Fi radio, a cellular radio, a Bluetooth radio, a battery, an accelerometer, a gyroscope, an inertial measurement unit, a solid state memory, a random access memory, a hard disk drive, a microphone, a speaker, and an induction coil.

Further, the first integrated circuit or the second integrated circuit can be located within a package. The present subject matter can be used in combination with a wide variety of packaging structures. In an example, the package can be selected from the group consisting of a micro leadframe package, a quad flat no-lead package, a quad flat package, a dual flat no-lead package, a dual flat package, a ball grid array, a land grid array, a chip carrier, wire bond die, a leadless chip carrier, embedded Wafer Level Build-Up (eWLB), or the like. The present subject matter can be used to electrically and physically couple the aforementioned packages to another package, substrate, motherboard, or the like. Stated another way, the combination of an electrically conductive adhesive and a second adhesive can be used to electrically and physically couple a wide variety of electrical devices and components to other electrical devices and components (e.g., coupling a first electronic component to a second electronic component).

In an example, an electrically conductive adhesive (e.g., electrically conductive adhesive 780) can be applied to the interconnects of a quad flat no-lead package. A second adhesive (e.g. second adhesive 740) can be applied to the areas outside of the area where the interconnects are located (and the electrically conductive adhesive has been applied). The quad flat no-lead package can be brought into communication (e.g., within physical proximity) of another package, substrate, motherboard, or the like, and then processed. The processing can self-align, and cure, the electrically conductive adhesive into a dielectric portion and a conducting portion. The processing can cure the second adhesive. After appropriate processing has been completed, the quad flat no-lead package will be electrically and physically coupled to the package, substrate, motherboard, or the like.

VARIOUS NOTES & EXAMPLES

Example 1 can include or use a system for packaging integrated circuits, comprising an integrated circuit having one or more integrated circuit terminals; a substrate having one or more substrate terminals; an electrically conductive adhesive in communication with the integrated circuit terminals and the substrate terminals, wherein: the electrically conductive adhesive establishes an electrical connection between each of the one or more integrated circuit terminals and the one or more substrate terminals; the electrical connection between each of the one or more integrated circuit terminals and the one or more substrate terminals are enclosed in a dielectric; and a second adhesive in communication with the integrated circuit and the substrate, wherein the second adhesive couples the integrated circuit and substrate together.

Example 2 can include, or can optionally be combined with the subject matter of Example 1, to optionally include that the electrically conductive adhesive is comprised of a mixture of a conductor and a polymer.

Example 3 can include, or can optionally be combined with the subject matter of one or any combination of Examples 1 or 2 to optionally include that the conductor includes solder.

Example 4 can include, or can optionally be combined with the subject matter of one or any combination of Examples 1 through 3 to optionally include that the electrically conductive adhesive is a composite of one or more metals and one or more polymers.

Example 5 can include, or can optionally be combined with the subject matter of one or any combination of Examples 1 through 4 to optionally include that the electrically conductive adhesive is configured to self-align into a conducting portion and a dielectric portion when exposed to changing processing conditions.

Example 6 can include, or can optionally be combined with the subject matter of one or any combination of Examples 1 through 5 to optionally include that the integrated circuit is one or more dice.

Example 7 can include, or can optionally be combined with the subject matter of one or any combination of Examples 1 through 6 to optionally include that the integrated circuit is located on a silicon wafer Example 8 can include, or can optionally be combined with the subject matter of one or any combination of Examples 1 through 7 to optionally include that the integrated circuit is located within a package.

Example 9 can include, or can optionally be combined with the subject matter of one or any combination of Examples 1 through 8 to optionally include that the package is selected from the group consisting of a micro leadframe package, a quad flat no-lead package, a quad flat package, a dual flat no-lead package, a dual flat package, a ball grid array, a land grid array, a chip carrier, a wire bond die, and a leadless chip carrier.

Example 10 can include or use a method for forming an integrated circuit, comprising preparing an integrated circuit having one or more integrated circuit terminals and a substrate having one or more substrate terminals, for interconnection, wherein the interconnection occurs through the use of an electrically conductive adhesive and a second adhesive; placing an integrated circuit having one or more integrated circuit terminals on the substrate, wherein the placing of the integrated circuit on the substrate includes: bringing the electrically conductive adhesive into communication with the one or more substrate terminals and the one or more integrated circuit terminals, and bringing the second adhesive into communication with the substrate and the integrated circuit; processing the electrically conductive adhesive to form both a conducting portion and an adjacent dielectric portion, wherein: the conducting portion establishes an electrical connection between each of the one or more substrate terminals and the one or more integrated circuit terminals; and the adjacent dielectric portion electrically isolates each of the conducting portions from the other conducting portions.

Example 11 can include, or can optionally be combined with the subject matter of Example 10, to optionally include that preparing the integrated circuit and the substrate includes: transferring the second adhesive onto the substrate; and transferring the electrically conductive adhesive onto one or more substrate terminals.

Example 12 can include, or can optionally be combined with the subject matter of one or any combination of Examples 10 or 11 to optionally include that preparing the integrated circuit and the substrate includes partially curing the second adhesive prior to transferring the electrically conductive adhesive.

Example 13 can include, or can optionally be combined with the subject matter of one or any combination of Examples 10 through 12 to optionally include that preparing the integrated circuit and the substrate includes: transferring the second adhesive onto the integrated circuit; and transferring the electrically conductive adhesive onto one or more integrated circuit terminals.

Example 14 can include, or can optionally be combined with the subject matter of one or any combination of Examples 10 through 13 to optionally include that the second adhesive and the electrically conductive adhesive are transferred onto the substrate and the substrate terminals, respectively, by a process selected from the group consisting of spraying, printing, vapor deposition, stenciling, laminating, and lithography.

Example 15 can include, or can optionally be combined with the subject matter of one or any combination of Examples 10 through 14 to optionally include that preparing the integrated circuit and the substrate includes partially curing the second adhesive prior to transferring the electrically conductive adhesive.

Example 16 can include, or can optionally be combined with the subject matter of one or any combination of Examples 10 through 15 to optionally include that processing the electrically conductive adhesive includes altering the temperature of the electrically conductive adhesive.

Example 17 can include, or can optionally be combined with the subject matter of one or any combination of Examples 10 through 16 to optionally include that processing the electrically conductive adhesive includes heating the electrically conductive adhesive, the heating resulting in segregation of the conductor from the adhesive and into a conducting portion and a dielectric portion, respectively.

Example 18 can include, or can optionally be combined with the subject matter of one or any combination of Examples 10 through 17 to optionally include that processing the electrically conductive adhesive includes altering the pressure that is applied to the electrically conductive adhesive.

Example 19 can include, or can optionally be combined with the subject matter of one or any combination of Examples 10 through 18 to optionally include that processing the electrically conductive adhesive includes the electrically conductive adhesive self-aligning into a conducting portion and a dielectric portion when exposed to changing processing conditions.

Example 20 can include, or can optionally be combined with the subject matter of one or any combination of Examples 10 through 19 to optionally include singulating the integrated circuit from a silicon wafer.

Example 21 can include or use a system for packaging integrated circuits, comprising: a first integrated circuit having one or more integrated circuit terminals; a substrate having one or more substrate terminals; an electrically conductive adhesive in communication with the integrated circuit terminals and the substrate terminals, wherein: the electrically conductive adhesive establishes an electrical connection between each of the one or more integrated circuit terminals and the one or more substrate terminals; the electrical connection between each of the one or more integrated circuit terminals and the one or more substrate terminals are enclosed in a dielectric; a second adhesive in communication with the integrated circuit and the substrate, wherein the second adhesive couples the integrated circuit and the substrate together; a motherboard in electrical communication with the substrate; and a second integrated circuit in electrical communication with the motherboard and the substrate.

Example 22 can include, or can optionally be combined with the subject matter of Examples 21 to optionally include that the first integrated circuit is a first die and the second integrated circuit is a second die.

Example 23 can include, or can optionally be combined with the subject matter of one or any combination of Examples 21 through 22 to include an electronic component in electrical communication with the motherboard.

Example 24 can include, or can optionally be combined with the subject matter of one or any combination of Examples 21 through 23 to include that the electronic component is selected from the group consisting of a processor, a touch pad, a display, a global positioning system receiver, a Wi-Fi radio, a cellular radio, a Bluetooth radio, a battery, an accelerometer, a gyroscope, an inertial measurement unit, a solid state memory, a random access memory, a hard disk drive, a microphone, a speaker, and an induction coil.

Example 25 can include, or can optionally be combined with the subject matter of one or any combination of Examples 21 through 24 to include that the first integrated circuit or the second integrated circuit is located within a package.

Example 26 can include, or can optionally be combined with the subject matter of one or any combination of Examples 21 through 25 to include that the package is selected from the group consisting of a micro leadframe package, a quad flat no-lead package, a quad flat package, a dual flat no-lead package, a dual flat package, a ball grid array, a land grid array, a chip carrier, a wire bond die, and a leadless chip carrier.

Example 27 can include, or can optionally be combined with the subject matter of one or any combination of Examples 21 through 26 the second adhesive is thermally conductive and electrically insolating.

Example 28 can include, or can optionally be combined with any portion or combination of any portions of any one or more of Examples 1 through 20 to include, subject matter that can include means for performing any one or more of the functions of Examples 1 through 27, or a machine-readable medium including instructions that, when performed by a machine, cause the machine to perform any one or more of the functions of Examples 1 through 27.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc, are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system for packaging integrated circuits, comprising:
an integrated circuit having one or more integrated circuit terminals;
a substrate having one or more substrate terminals;
an electrically conductive adhesive in communication with the integrated circuit terminals and the substrate terminals, wherein:
the electrically conductive adhesive establishes an electrical connection between each of the one or more integrated circuit terminals and the one or more substrate terminals;

the electrical connection between each of the one or more integrated circuit terminals and the one or more substrate terminals are enclosed in a dielectric portion of the electrically conductive adhesive; and a second adhesive in communication with the integrated circuit and the substrate, wherein the second adhesive:
is electrically non-conductive,
couples the integrated circuit and substrate together, and
the second adhesive interfaces with the dielectric portion of the conductive adhesive.

2. The system for packaging integrated circuits of claim 1, wherein the electrically conductive adhesive is comprised of a mixture of a conductor and a polymer.

3. The system for packaging integrated circuits of claim 2, wherein the conductor includes solder.

4. The system for packaging integrated circuits of claim 1, wherein the electrically conductive adhesive is a composite of one or more metals and one or more polymers.

5. The system for packaging integrated circuits of claim 1, wherein the electrically conductive adhesive is configured to self-align into a conducting portion and a dielectric portion when exposed to changing processing conditions.

6. The system for packaging integrated circuits of claim 1, wherein the integrated circuit is one or more dice.

7. The system for packaging integrated circuits of claim 1, wherein the integrated circuit is located on a silicon wafer.

8. The system of claim 1, wherein the integrated circuit is located within a package.

9. The system of claim 8, wherein the package is selected from the group consisting of a micro leadframe package, a quad flat no-lead package, a quad flat package, a dual flat no-lead package, a dual flat package, a ball grid array, a land grid array a chip carrier, a wire bond die, and a leadless chip carrier.

10. The system for packaging integrated circuits of claim 1, wherein the second adhesive is thermally conductive and electrically insulating.

11. A method for forming an integrated circuit, comprising:
preparing an integrated circuit having one or more integrated circuit terminals and a substrate having one or more substrate terminals, for interconnection; wherein the interconnection occurs through the use of an electrically conductive adhesive and a second adhesive;
placing an integrated circuit having one or more integrated circuit terminals on the substrate, wherein the placing of the integrated circuit on the substrate includes:
bringing the electrically conductive adhesive into communication with the one or more substrate terminals and the one or more integrated circuit terminals;
bringing the second adhesive into communication with the substrate and the integrated circuit;
processing the electrically conductive adhesive to form both a conducting portion and an adjacent dielectric portion, wherein:
the conducting portion establishes an electrical connection between each of the one or more substrate terminals and the one or more integrated circuit terminals;
the adjacent dielectric portion electrically isolates each of the conducting portions from the other conducting portions; and
the second adhesive is non-conductive and interfaces with the electrically conductive adhesive.

12. The method for forming an integrated circuit of claim 11, wherein preparing the integrated circuit and the substrate includes:
transferring the second adhesive onto the substrate; and
transferring the electrically conductive adhesive onto one or more substrate terminals.

13. The method for forming an integrated circuit of claim 12, wherein the second adhesive and the electrically conductive adhesive are transferred onto the substrate and the substrate terminals, respectively, by a process selected from the group consisting of spraying, printing, vapor deposition, stenciling, and lithography.

14. The method for forming an integrated circuit of claim 12, wherein preparing the integrated circuit and the substrate includes partially curing the second adhesive prior to transferring the electrically conductive adhesive.

15. The method for forming an integrated circuit of claim 11, wherein preparing the integrated circuit and the substrate includes:
transferring the second adhesive onto the integrated circuit; and
transferring the electrically conductive adhesive onto one or more integrated circuit terminals.

16. The method for forming an integrated circuit of claim 15, wherein the second adhesive and the electrically conductive adhesive are transferred onto the integrated circuit and the integrated circuit terminals, respectively, by a process selected from the group consisting of spraying, printing, vapor deposition, stenciling, laminating, and lithography.

17. The method for forming an integrated circuit of claim 15, wherein preparing the integrated circuit and the substrate includes partially curing the second adhesive prior to transferring the electrically conductive adhesive.

18. The method for forming an integrated circuit of claim 11, wherein processing the electrically conductive adhesive includes altering the temperature of the electrically conductive adhesive.

19. The method for forming an integrated circuit of claim 11, further comprising simulating the integrated circuit from a silicon wafer.

20. A system for packaging integrated circuits, comprising:
a first integrated circuit having one or more integrated circuit terminals;
a substrate having one or more substrate terminals;
an electrically conductive adhesive in communication with the integrated circuit terminals and the substrate terminals, wherein:
the electrically conductive adhesive establishes an electrical connection between each of the one or more integrated circuit terminals and the one or more substrate terminals;
the electrical connection between each of the one or more integrated circuit terminals and the one or more substrate terminals are enclosed in a dielectric portion of the electrically conductive adhesive;
a second adhesive in communication with the integrated circuit and the substrate, wherein the second adhesive:
is electrically non-conductive,
couples the integrated circuit and the substrate together, and the second adhesive interfaces with the dielectric portion of the conductive adhesive;
a motherboard in electrical communication with the substrate; and
a second integrated circuit in electrical communication with the motherboard and the substrate.

21. The system of claim 20, wherein the first integrated circuit is a first die and the second integrated circuit is a second die.

22. The system of claim 20, further comprising an electronic component in electrical communication with the motherboard.

23. The system of claim 22, wherein the electronic component is selected from the group consisting of a processor, a touch pad, a display, a global positioning system receiver, a Wi-Fi radio, a cellular radio, a Bluetooth radio, a battery, an accelerometer, a gyroscope, an inertial measurement unit, a solid state memory, a random access memory, a hard disk drive, a microphone, a speaker, and an induction coil.

24. The system of claim 20, wherein the first integrated circuit or the second integrated circuit is located within a package.

25. The system of claim 24, wherein the package is selected from the group consisting of a micro leadframe package, a quad flat no-lead package, a quad flat package, a dual flat no-lead package, a dual flat package, a ball grid array, a land grid array a chip carrier, a wire bond die, and a leadless chip carrier.

\* \* \* \* \*

UNITED STATES PATENT AND TRADEMARK OFFICE
CERTIFICATE OF CORRECTION

PATENT NO. : 10,629,557 B2
APPLICATION NO. : 16/464930
DATED : April 21, 2020
INVENTOR(S) : Strong et al.

Page 1 of 1

It is certified that error appears in the above-identified patent and that said Letters Patent is hereby corrected as shown below:

In the Claims

In Column 15, Line 35, in Claim 9, delete "array" and insert --array,-- therefor In Column 15, Line 44, in Claim 11, delete "interconnection;" and insert --interconnection,-- therefor In Column 16, Line 40, in Claim 19, delete "simulating" and insert --singulating-- therefor In Column 17, Line 22, in Claim 25, delete "array" and insert --array,-- therefor Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*